(12) United States Patent
Gottwald et al.

(10) Patent No.: US 10,777,503 B2
(45) Date of Patent: Sep. 15, 2020

(54) METHOD FOR CONTACTING A METALLIC CONTACT PAD IN A PRINTED CIRCUIT BOARD AND PRINTED CIRCUIT BOARD

(71) Applicant: Schweizer Electronic AG, Schramberg (DE)

(72) Inventors: Thomas Gottwald, Dunningen (DE); Christian Rössle, St. Georgen (DE)

(73) Assignee: SCHWEIZER ELECTRONIC AG, Schramberg (DE)

( * ) Notice: Subject to any disclaimer, the term of this patent is extended or adjusted under 35 U.S.C. 154(b) by 0 days.

(21) Appl. No.: 15/973,869

(22) Filed: May 8, 2018

(65) Prior Publication Data
US 2018/0331033 A1    Nov. 15, 2018

(30) Foreign Application Priority Data
May 11, 2017  (DE) .......................... 10 2017 207 988

(51) Int. Cl.
*H01L 23/00* (2006.01)
*H01L 23/528* (2006.01)
(Continued)

(52) U.S. Cl.
CPC ...... *H01L 23/5283* (2013.01); *H01L 21/4857* (2013.01); *H01L 23/535* (2013.01);
(Continued)

(58) Field of Classification Search
CPC .............................. H01L 23/535; H01L 23/52
See application file for complete search history.

(56) References Cited

U.S. PATENT DOCUMENTS 6,043,986 A     3/2000  Kondo
10,448,501 B2 * 10/2019 Wu ...................... H05K 1/0251
(Continued)

FOREIGN PATENT DOCUMENTS

DE    197 23 409 A1   12/1998
DE    198 18 502 C1   10/1999
(Continued)

OTHER PUBLICATIONS

Search Report in the priority application DE 10 2017 207988.6, German Patent Office, dated Apr. 13, 2018.
(Continued)

*Primary Examiner* — Caridad Everhart
*Assistant Examiner* — Ankush K Singal
(74) *Attorney, Agent, or Firm* — Shlesinger, Arkwright & Garvey LLP

(57) ABSTRACT

A method for contacting a metallic contact pad embedded in a printed circuit board layer sequence, comprising the steps of producing a first hole matrix having a plurality of holes in a surface of the printed circuit board layer sequence in order to partly expose the metallic contact pad, of applying a metal layer in order to at least partly fill the holes of the first hole matrix, of producing a second hole matrix having a plurality of holes in the surface of the printed circuit board layer sequence in order to partly expose the metallic contact pad, wherein the holes of the second hole matrix are arranged in a manner offset relative to the holes of the first hole matrix, and of applying a metal layer in order to at least partly fill the holes of the second hole matrix, and a correspondingly produced printed circuit board.

20 Claims, 5 Drawing Sheets

(51) Int. Cl.
*H01L 23/538* (2006.01)
*H01L 21/48* (2006.01)
*H01L 23/535* (2006.01)
*H05K 1/11* (2006.01)
*H05K 1/18* (2006.01)
*H05K 3/42* (2006.01)
*H05K 3/40* (2006.01)

(52) U.S. Cl.
CPC .......... *H01L 23/5389* (2013.01); *H05K 1/115* (2013.01); *H05K 1/185* (2013.01); *H05K 3/423* (2013.01); *H01L 2224/18* (2013.01); *H05K 3/4007* (2013.01); *H05K 2201/09609* (2013.01); *H05K 2201/10166* (2013.01)

(56) References Cited

U.S. PATENT DOCUMENTS

| | | |
|---|---|---|
| 2004/0022677 A1* | 2/2004 | Wohlstadter ............ B01L 9/56 422/52 |
| 2007/0095471 A1 | 5/2007 | Ito et al. |
| 2007/0230150 A1 | 10/2007 | Castriotta et al. |
| 2009/0294161 A1* | 12/2009 | Yoshimura ........... H05K 3/4608 174/258 |
| 2009/0294165 A1 | 12/2009 | Thomas |
| 2011/0117357 A1 | 5/2011 | Hatanaka et al. |
| 2011/0133311 A1* | 6/2011 | Watanabe ......... H01L 21/76808 257/532 |
| 2011/0203842 A1* | 8/2011 | Russell ................ H05K 1/0222 174/266 |
| 2011/0209911 A1* | 9/2011 | Ishida .................. H05K 1/0222 174/264 |
| 2013/0200528 A1* | 8/2013 | Lin ....................... H01L 21/561 257/774 |
| 2017/0245365 A1* | 8/2017 | Ishihara .............. H01L 21/4857 |
| 2018/0323137 A1* | 11/2018 | Kang ................ H01L 23/49827 |
| 2019/0221534 A1* | 7/2019 | Chen ...................... H01L 24/05 |

FOREIGN PATENT DOCUMENTS

| | | |
|---|---|---|
| EP | 0 883 332 B1 | 3/1998 |
| JP | 2015-029033 A | 12/2015 |

OTHER PUBLICATIONS

Office Action, Priority Application DE 10 2018 207 127.6, dated Apr. 17, 2020.

* cited by examiner

METHOD FOR CONTACTING A METALLIC CONTACT PAD IN A PRINTED CIRCUIT BOARD AND PRINTED CIRCUIT BOARD

RELATED APPLICATIONS

This is a nonprovisional application claiming the priority of Germany Patent Application No. 102017207988.6, filed on May 11, 2017, hereby incorporated by reference.

TECHNICAL FIELD

The present invention relates to a method for contacting a metallic contact pad embedded in a printed circuit board layer sequence, and to a printed circuit board comprising a metallic contact pad embedded therein.

DESCRIPTION OF THE PRIOR ART

Metallic contact pads introduced or embedded in printed circuit boards, e.g. contact pads on components such as, for example, semiconductors, power semiconductors, chips, transistors, or on ceramic layers or the like, have to be contacted for the purpose of connecting to a circuit and/or for the purpose of heat dissipation.

It is known from the prior art to expose a metallic contact pad (e.g. composed of copper) of a component embedded in a printed circuit board layer sequence and then to apply a metal for contacting the contact pad. In this case, in particular during the contacting of power semiconductors, the contact pad is often exposed over a large area in order to produce a large contact. This has the advantage of a high current conductivity and a low thermal resistance. What is often problematic in the prior art, however, is that a planar surface does not arise during large-area application of metal to the exposed region. This can lead to difficulties when the printed circuit board is subsequently applied to a heat sink.

As an alternative to the large-area exposure of the contact pads, the contact can also be produced by a plurality of parallel blind holes which can then be filled with copper galvanically. With the use of blind holes, although a planar surface is obtained, the connection is carried out only at points in a grid pattern defined by a maximum hole size and a minimum hole spacing. In this case, the maximum hole size and the minimum hole spacing are in the region of approximately 200 µm. The maximum connection of such a grid pattern is therefore less than 50%. If the hole spacing falls below the minimum hole spacing, there is the risk of the prepreg layer losing adhesion and thus of a reliable metallization no longer being able to be produced.

SUMMARY OF THE INVENTION

Taking this as a departure point, a method and a printed circuit board having the features as disclosed herein are proposed. Embodiments of the invention are described herein.

According to the invention, for the purpose of contacting a metallic surface of a contact pad embedded into a printed circuit board layer structure, firstly a number of first holes are introduced into a surface of the printed circuit board configuration and said number of first holes are subsequently filled with conductive material. A number of second holes are subsequently introduced between the filled first holes into the surface of the printed circuit board configuration in order likewise subsequently to be filled with conductive material.

The invention is based on the insight that the production of holes for exposing the contact pads is advantageous by comparison with large-area exposure of the contact pads. The dimensions of the holes can be chosen such that the subsequently applied metal layer has an optimum surface and in particular a good planarity. This facilitates further process steps such as, for example, applying the printed circuit board to a heat sink, since, on account of the high planarity of the metal surface, either the latter can be applied directly to the heat sink or subsequent surface processing steps (e.g. grinding) are at least less complicated.

According to the invention, the method comprises the following steps:

producing a first hole matrix having a plurality of first holes in a surface of the printed circuit board layer sequence in order to partly expose the metallic contact pad, applying a metal layer in order to at least partly fill the first holes, producing a second hole matrix having a plurality of second holes in the surface of the printed circuit board layer sequence in order to partly expose the metallic contact pad, wherein the holes of the second hole matrix are arranged in a manner offset relative to the holes of the first hole matrix, applying a metal layer in order to at least partly fill the second holes.

The plurality of first holes introduced initially together form a first hole matrix. In the context of the present invention, the term "hole matrix" denotes a totality of the holes situated in a specific arrangement with respect to one another.

In a further step, the first holes are at least partly filled or filled in by the application of a metal layer. The exposed regions of the metallic contact pad thereby come into contact with the applied metal layer.

In addition, a plurality of second holes are produced in the surface of the printed circuit board layer sequence and the metallic contact pad is at least partly exposed in this way. The plurality of the second holes produced in this step together form the second hole matrix. The holes of the second hole matrix are offset relative to the holes of the first hole matrix. This means that the holes of different hole matrices are arranged at different positions. The positions of the holes of the second hole matrix can be chosen such that they do not overlap the holes of the first hole matrix, or they can also be chosen in an overlapping fashion (an overlapping arrangement can serve, if appropriate, to remove dielectric residues from the corners of the first holes). The holes thus produced are then likewise at least partly filled by a metal layer.

By way of example, the production of holes is carried out by means of a process sequence comprising removing the copper by means of etching technology, followed by eroding the dielectric as far as the metallic surface to be linked, such as by means of a laser ablation process that acts selectively on the dielectric.

In known production methods, the holes may be able to be produced only with a specific minimum spacing with respect to one another. By way of example, with known laser drilling methods within one process step it is possible to produce holes having a diameter of a maximum of approximately 200 µm with a minimum hole spacing of approximately 400 µm. This inevitably gives rise to an interspace between the holes, which interspace cannot be utilized for the contacting. The area utilization of a contact produced in this way is only approximately 35% in this case. If the hole diameters are chosen to be larger, the process of filling with Cu electrolytically/galvanically does not function any more since the metallization then traces the profile, which leads to a deeper metallized area with the disadvantages described. If the hole spacing is chosen to be significantly smaller, there is the risk of the dielectric losing adhesion on the metallic contact and the subsequent electrolytic processing being carried out erroneously.

By providing the second hole matrix according to the invention, the holes of which are offset relative to those of the first hole matrix, it is possible, however, for the contact pad area present to be utilized significantly better. In this regard, a large contact pad having a higher thermal mass and thus a low thermal resistance and a high current conductivity and moreover a lower on resistance is produced, at the same time a good planarity of the contact surfaces being maintained or obtained (improved linking). The hole matrices can be produced for example by laser drilling or by an etching method in each case followed by dielectric erosion by means of laser processing.

The first hole matrix and the second hole matrix can be formed respectively by a first grid and a second grid. In this context, the term "grid" means that the respective holes have a regular arrangement relative to one another. In this case, the holes have identical spacings from one another along a spatial direction. The regularity can exist both along a first spatial direction and along a second spatial direction different than the first spatial direction. In this case, the holes have identical spacings from one another along the second direction as well. The spacings of two holes along the first spatial direction can correspond to the spacings of the holes along the second spatial direction.

The first and/or the second grid can additionally be rectangular. This means that the first spatial direction is oriented perpendicularly to the second spatial direction. This facilitates the production of the holes since production methods for producing holes are often designed for a rectangular arrangement.

The arrangement of the holes in a grid can be described for example with the aid of an imaginary coordinate system and a two-dimensional basis {a,b} consisting of the basis vectors a and b that span the grid. In this case, the basis vectors are different than zero and point in different spatial directions. A hole matrix forms a grid if the position of each hole proceeding from an origin of the imaginary coordinate system can be described by an addition of the basis vectors in accordance with (n·a+m·b) wherein n and m are to be selected from the set of integers. The position of a hole is then unambiguously defined by the indication of the values (n,m). In this case, the origin of the imaginary coordinate system can be placed for example at the midpoint of one of the holes. A hole is then situated at the origin of the imaginary coordinate system, and also for example at the positions (1,0), (2,0), (3,0), (0,1), (0,2), (0,3), (1,1), (1,2), (2,1), etc. Holes arranged in a grid can be produced significantly more simply. Moreover, on account of the regular arrangement of the holes in a grid over the entire contact pad area the contact pads are contacted homogeneously, which is accompanied by homogeneous contact properties.

Provision can be made for the first grid and the second grid to be spanned by a two-dimensional basis {a,b}, wherein the holes of the first grid are arranged at the locations (n,m), and wherein the holes of the second grid are arranged at the locations ((n+½),(m+½)), wherein n and m are to be selected from the set of integers. In this case, the first grid is offset relative to the second grid such that each hole of one grid is situated in the middle between two holes of the respective other grid. This increases the homogeneity of the contact even further and additionally leads to good space utilization.

The holes can have an arbitrary shape, in principle. In possible embodiments, the hole matrices comprise circular holes and/or rectangular holes. By way of example, the holes can also have a square shape. In the case of square holes, the first hole matrix and the second hole matrix together can form a checkered pattern. As a result, virtually the entire contact pad area available can be utilized for contacting.

A further embodiment of the invention provides for a third hole matrix having a plurality of third holes to be produced in the surface of the printed circuit board layer sequence in order to partly expose the metallic contact pad, wherein the holes of the third hole matrix are arranged in a manner offset relative to the holes of the first and second hole matrices. After introducing the third hole matrix, applying a metal layer is in turn provided, such that the holes of the third hole matrix are at least partly filled with metal. The offset arrangement means here that the holes of the third hole matrix are arranged at different positions than the holes both of the first hole matrix and of the second hole matrix (in an overlapping or non-overlapping fashion, as described above). With the use of a further hole matrix, it is possible, if appropriate, to utilize an even greater proportion of the contact pad area for contacting.

The invention can be developed in an analogous manner by introducing further hole matrices with subsequent metal coating in each case.

By way of example, an electrolytic deposition method known to the person skilled in the art is appropriate for applying the metal layer, said deposition method depositing higher layer thicknesses in holes than on the surface. In this case, the process can be implemented such that an excess elevation of the coating metal arises above the holes to be filled, that is to say that the hole is as it were overfilled. This process implementation has the advantage that these excess elevations can be ground away in a subsequent work process, which contributes to a further improvement in the planarity of the surfaces.

The invention additionally relates to a printed circuit board comprising a printed circuit board layer sequence and a component embedded therein, said component having at least one metallic contact pad, wherein the at least one metallic contact pad is contacted with the aid of the method according to the invention. The printed circuit board can be developed by further features described in association with the method according to the invention.

Further advantages and configurations of the invention are evident from the description and the accompanying drawing.

It goes without saying that the features mentioned above and those yet to be explained below can be used not only in the combination respectively indicated, but also in other combinations or by themselves, without departing from the scope of the present invention.

The invention is illustrated schematically on the basis of exemplary embodiments in the drawing and is described thoroughly below with reference to the drawing.

DETAILED DESCRIPTION

Figure 1:
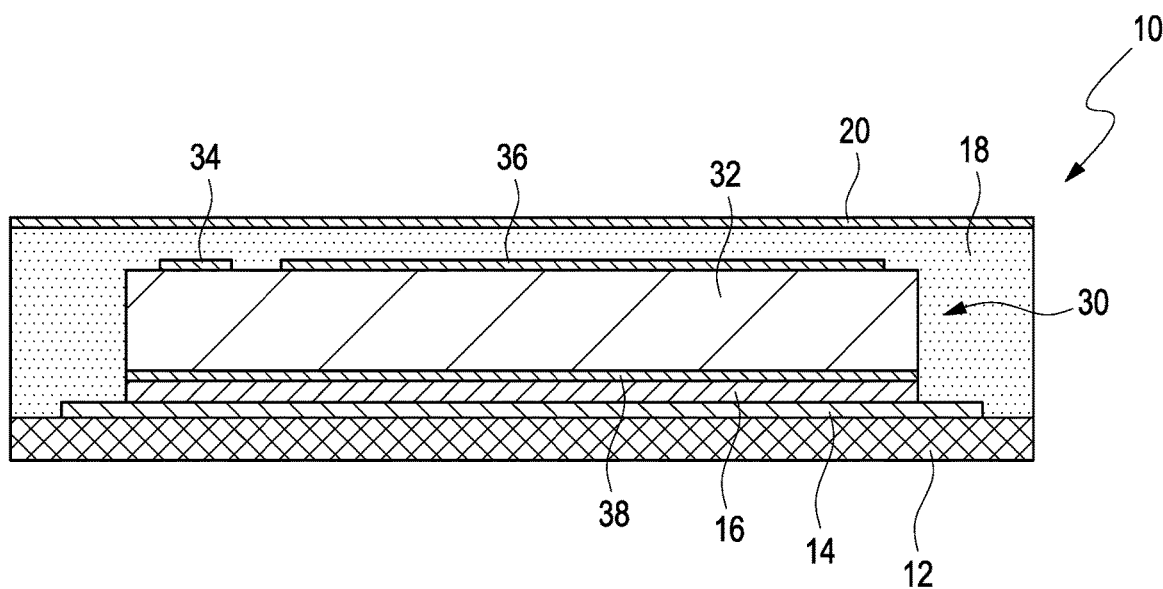
FIG. 1 shows a lateral sectional illustration of a printed circuit board with embedded component before the method according to the invention is performed.

FIG. 1 shows a printed circuit board layer sequence 10 of a printed circuit board in a lateral sectional illustration.

A component 30 is embedded into the printed circuit board layer sequence 10. In the exemplary embodiment illustrated, the layer sequence comprises a substrate layer 12 and a copper inner ply 14 applied thereon, the component 30 being applied on said copper inner ply by means of a contact layer or connection layer 16 (sintering layer or solder layer). The substrate layer 12 can be a conductive or a non-conductive printed circuit board material, such as an FR-4 inner ply, for example. In the former case, the copper inner ply 14 can be dispensed with.

The component 30 is embedded in a prepreg or dielectric layer 18, which terminates with a copper foil 20 applied thereon. The latter could also be omitted in one variant, such that only a dielectric layer is used. In this case, the surface and the hole walls would have to be coated conductively and with adhesive strength before copper can be deposited. That could be effected for example by sputtering of copper or chemical deposition.

The printed circuit board structure illustrated and described is purely by way of example, and any other structure deviating therefrom is readily apparent to the person skilled in the art.

The component 30 can be—as in the exemplary embodiment illustrated—a field effect transistor, comprising a semiconductor body 32 and terminals in the form of contact pads arranged thereon, which are designated by the reference signs 34 for the gate contact pad, 36 for the source contact pad, and 38 for the drain contact pad.

It is readily apparent to the person skilled in the art that any other form of component with corresponding contact pads for contacting can be used according to the invention.

The method according to the invention is explained below with reference to FIGS. 2 to 5, which show a partial excerpt from FIG. 1 at different stages of the method according to the invention. It is evident, in particular, how the source contact pad 36 is contacted with the aid of the method according to the invention.

Figure 2:
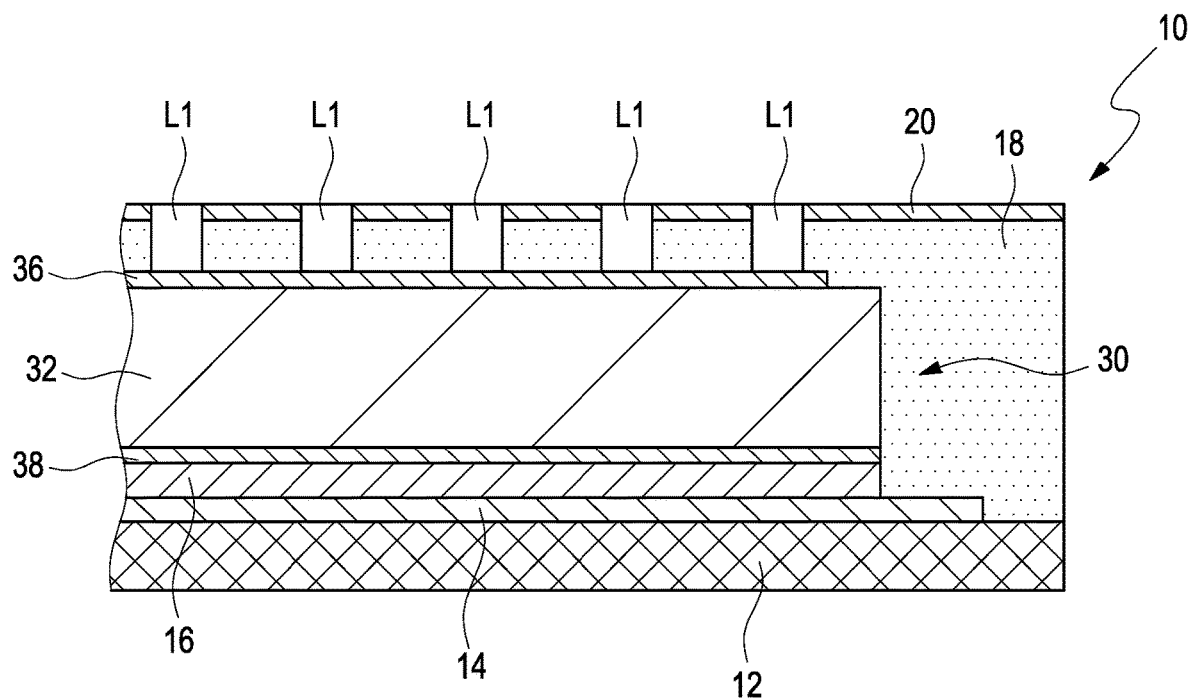
FIG. 2 shows an enlarged view of the printed circuit board shown in FIG. 1 after the process according to the invention of introducing a first hole matrix.

Firstly, e.g. by means of a laser drilling method or etching of the copper foil and erosion of the dielectric using a laser, substantially circular holes L1 are produced in the surface of the printed circuit board layer sequence 10. The copper foil 20 and the underlying dielectric 18 are removed as a result and the contact pad 36 is partly exposed. In the example illustrated, the holes L1 have a diameter of 100 to 200 µm. The holes have a spacing of 500 µm with respect to one another both along a first spatial direction and along a second spatial direction. In this case, the first spatial direction is perpendicular to the second spatial direction, such that the totality of the holes L1 forms a first square grid. This will be explained in greater detail below with reference to FIG. 6. The state after the production of the first hole matrix is shown in FIG. 2. The sectional plane of FIG. 2 runs along a diagonal of the square grid.

Figure 3:
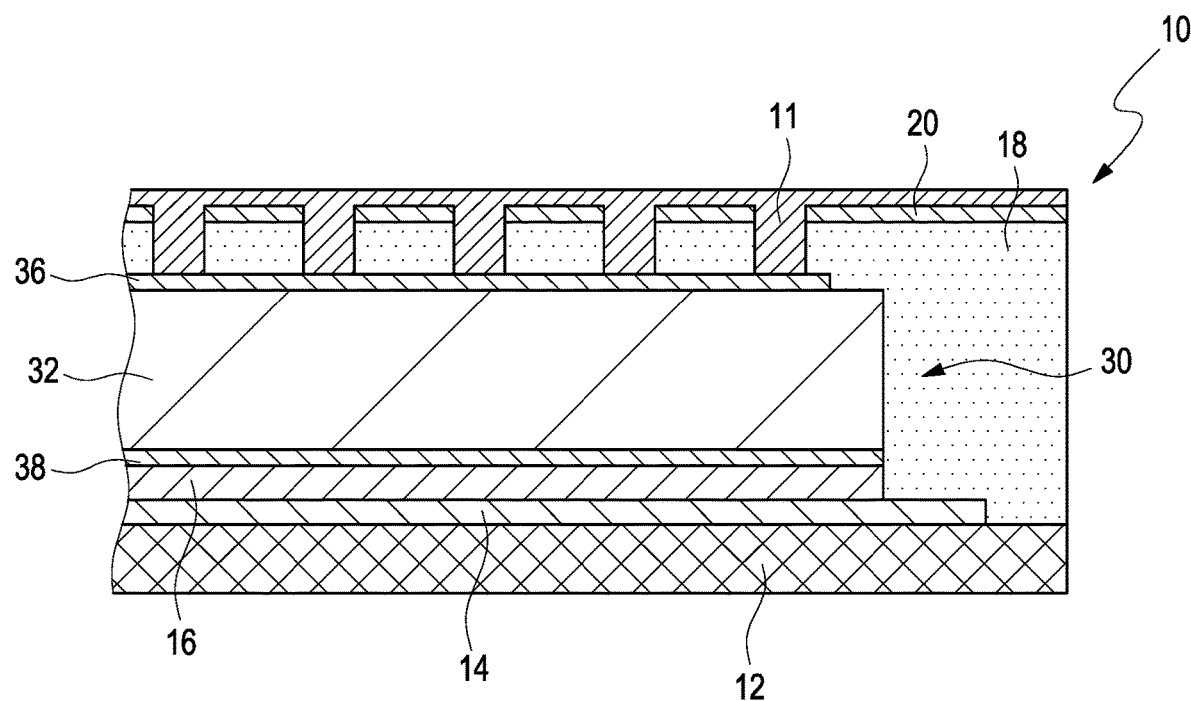
FIG. 3 shows the printed circuit board from FIG. 2 after the process according to the invention of filling the first hole matrix.
Figure 9:
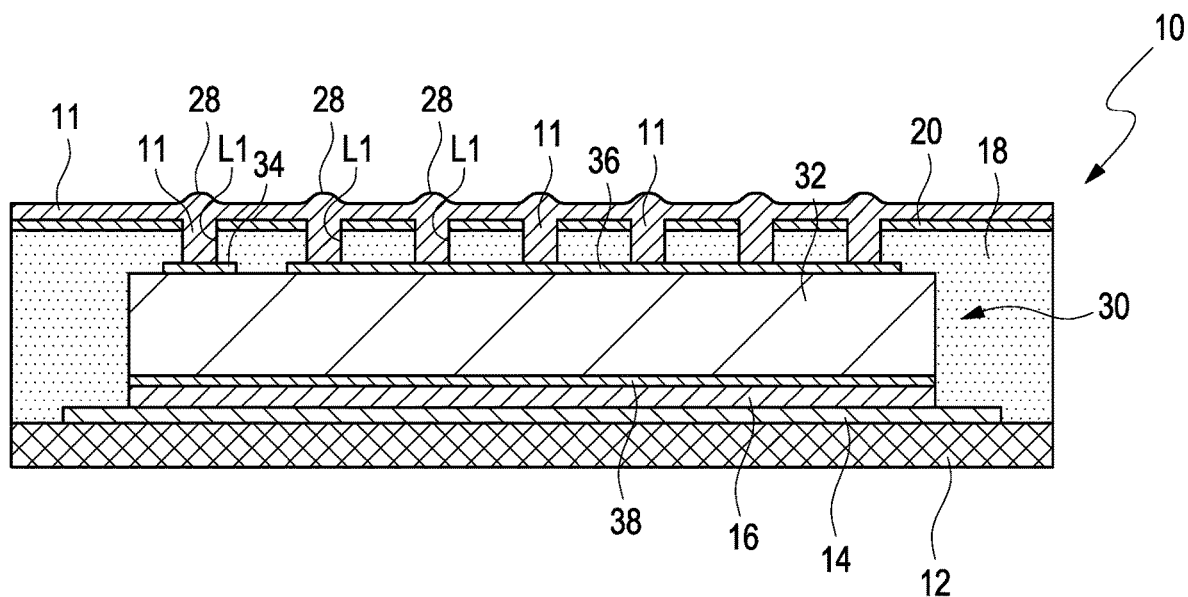
FIG. 9 illustrates, analogously to the illustration in FIG. 3, a deposition method for filling the first hole matrix with an excess elevation above the filled holes.
Figure 10:
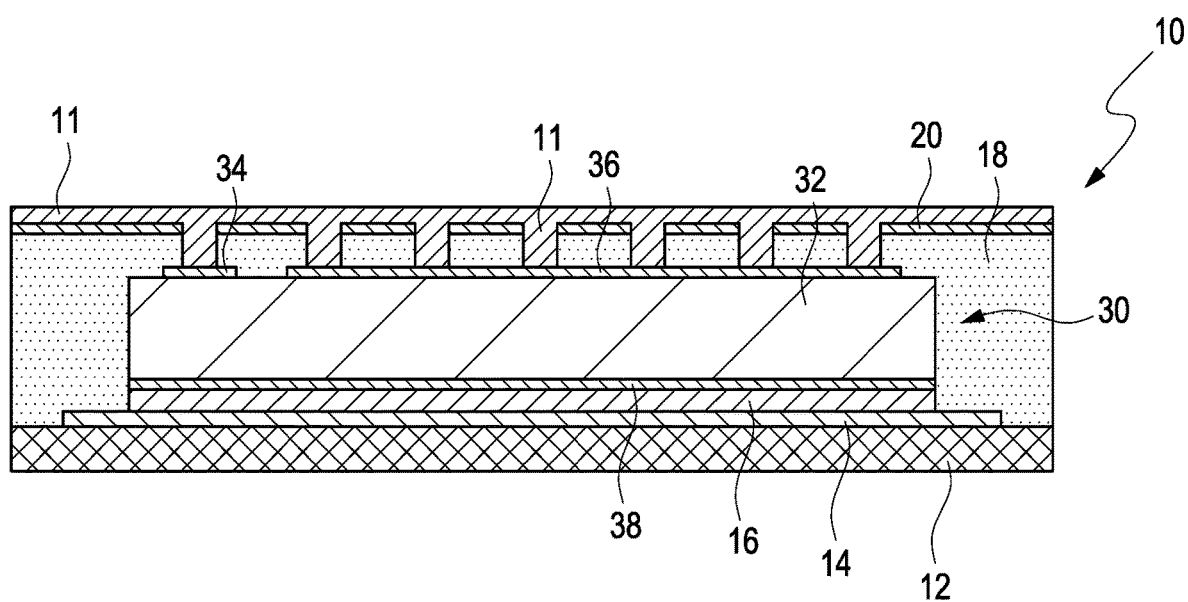
FIG. 10 shows the printed circuit board from FIG. 9 with ground-away surface.

Afterward, a metal layer 11 (also extends thinly on the copper foil 20) is applied, e.g. with the aid of an electrolytic deposition method or some other method known per se to the person skilled in the art, in order to fill the holes L1 with metal. This is illustrated in FIG. 3. The electrolytic method mentioned allows intensified application of the metal layer 11 into the regions exposed by the holes L1 and is thus particularly suitable for filling the holes L1, if appropriate also with an excess elevation 28 of the filling of the holes L1, as is illustrated in the depiction in FIG. 9. FIG. 10 shows the printed circuit board from FIG. 9 after planar grinding-away of the applied metal layer 11 for "leveling" the excess elevations 28.

Figure 4:
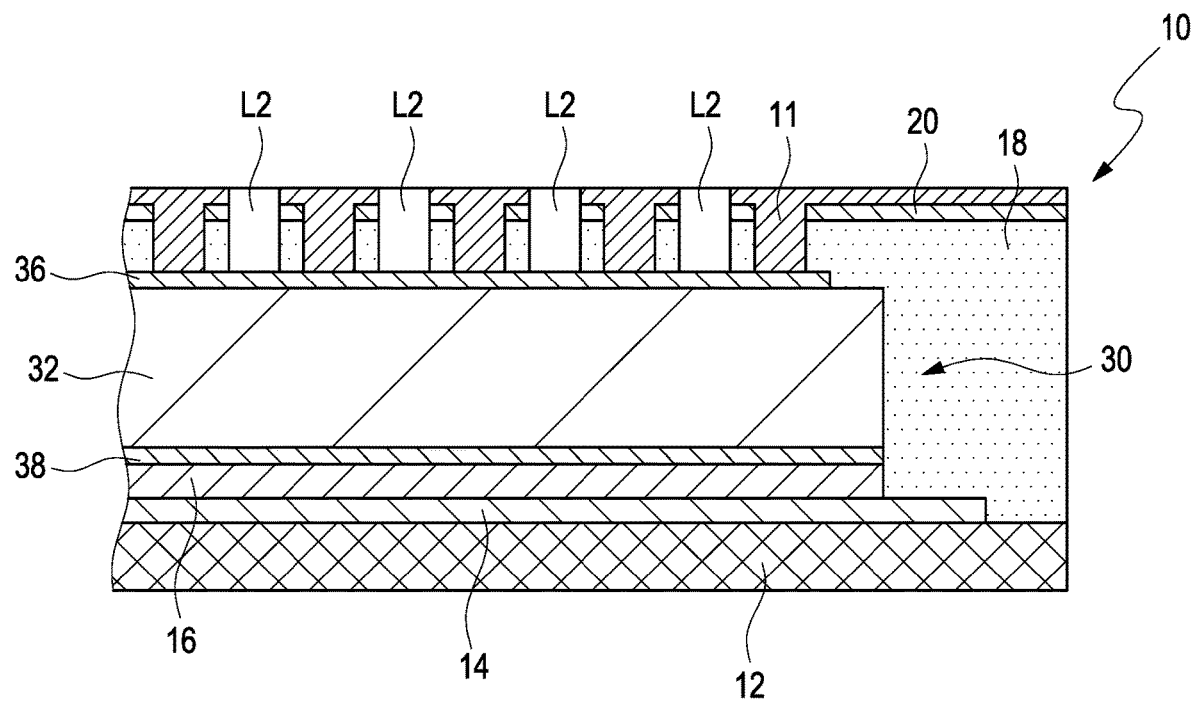
FIG. 4 shows the view from FIG. 3 after the process according to the invention of introducing a second hole matrix.

After the filling of the holes L1 of the first hole matrix, a second grid is produced in a subsequent process step, said second grid being formed by a plurality of holes L2. The second grid is likewise square with a hole spacing of 500 µm and a hole diameter of 200 µm. The second grid is offset relative to the first grid, such that the holes L2 of the second grid are situated in each case in the middle between two holes L1 of the first grid (and vice versa). The state after producing the holes L2 of the second grid is shown in FIG. 4.

Figure 5:
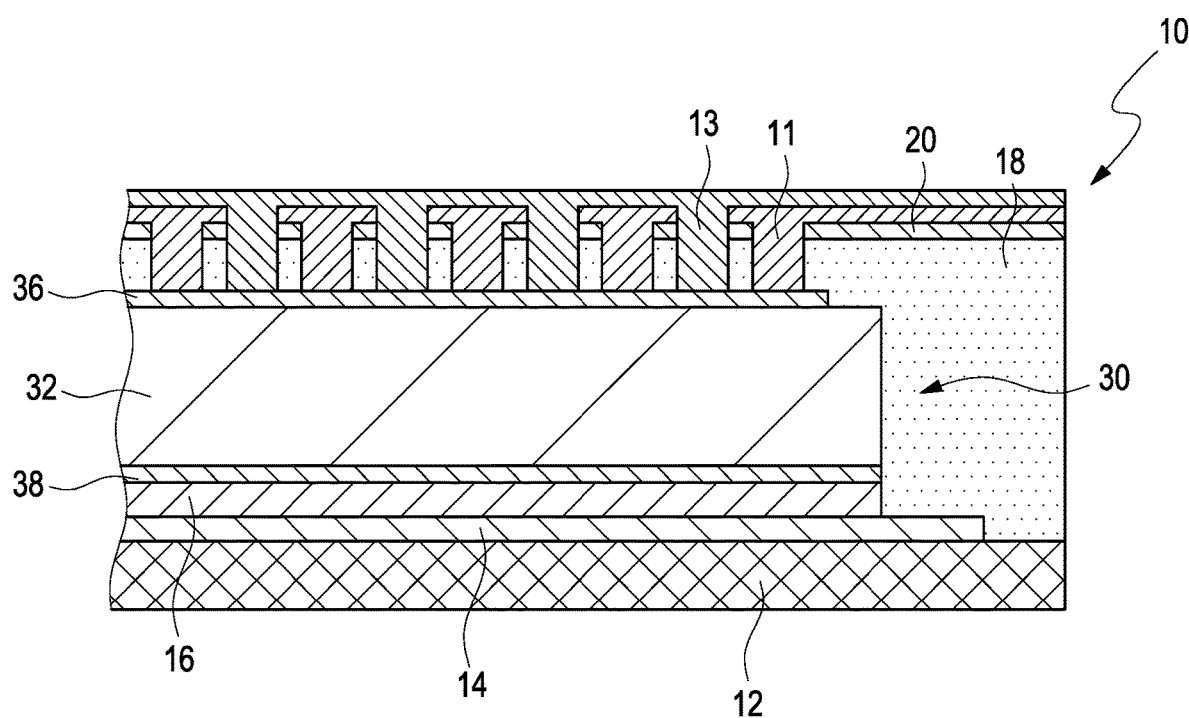
FIG. 5 shows the view from FIG. 4 after the process according to the invention of filling the second hole matrix.

Finally, in a subsequent process step, e.g. by means of the electrolytic filling method already mentioned above, a metal layer 13 is once again applied in order to fill the holes L2 of the second grid (cf. FIG. 5; resulting in an upper layer sequence 20, 11, 13).

Figure 6:
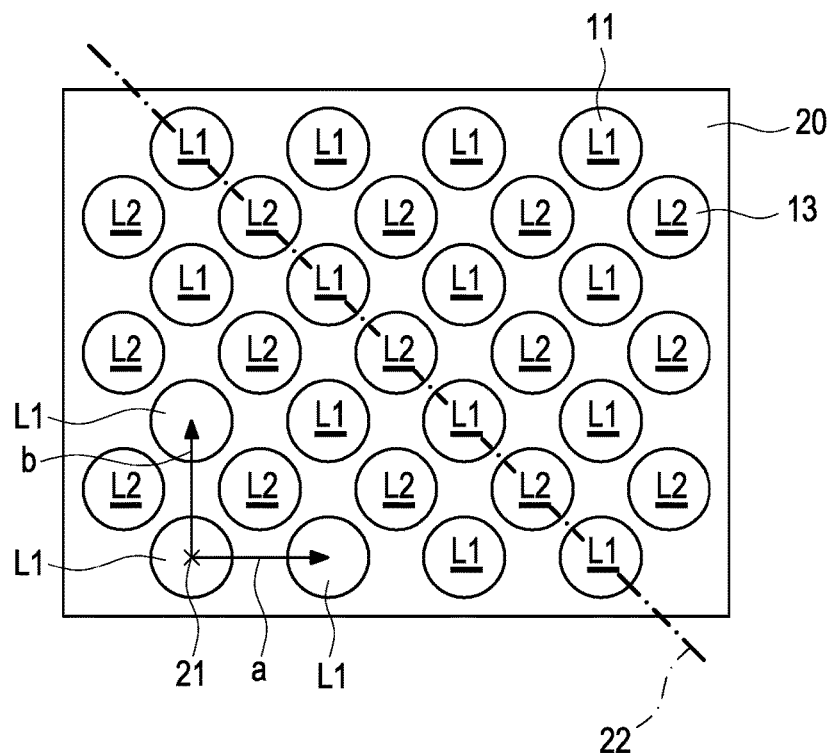
FIG. 6 shows a schematic view from above of a partial region of the printed circuit board according to the invention along a horizontal section through the layer plane of the copper foil from FIG. 5.

FIG. 6 shows a schematic view from above of an excerpt from the printed circuit board shown in FIG. 5 after the filling of the holes L2 of the second grid along a horizontal section through the layer plane of the copper foil 20. The sectional view schematically illustrates the copper foil 20, the holes L1 of the first grid, the metal layer 11 in the first holes L1, the holes L2 of the second grid and the second metal layer 13 in the second holes L2. The dashed line 22 indicates the sectional line along which the sectional views in FIGS. 1 to 5 are oriented. The sectional line 22 runs in a diagonal direction of the two square grids formed by the holes L1 and L2, respectively.

In order to clarify the mathematical description of the grids already used above, an origin 21 of an imaginary coordinate system and the basis vectors a and b are additionally depicted in FIG. 6. The two grids are thus spanned by the basis {a,b} in accordance with this description. The origin 21 is placed at the centre of a hole L1 of the first grid. As viewed from the origin, the vector a points to an adjacent hole L1 situated at the position (1,0). As viewed from the origin, the vector b points to an adjacent hole L1 situated at the position (0,1). The length (magnitude) of the vectors a and b is 500 µm in each case. The second grid is arranged such that a hole of the second grid is situated in each case substantially centrally between adjacent holes of the first grid. A hole of the second grid is arranged for example at the position (½, ½).

With use of a single hole matrix for contacting a contact pad, as known from the prior art, given a hole diameter of 200 µm and a hole spacing of 500 µm only approximately 35% of the existing area is utilized. By virtue of the second hole matrix according to the invention, the area utilization is increased to as much as 75%.

According to the invention—as shown e.g. in the illustration in FIG. 6—the arrangement of the holes can be orthogonal to one another (imaginary connections of the hole midpoints of adjacent hole pairs (L1, L2) complement one another to form a square or rectangle), but the arrangement can also deviate therefrom. The orthogonal arrangement is canceled in the exemplary embodiment with a third hole matrix described below.

Figures 7, 8:
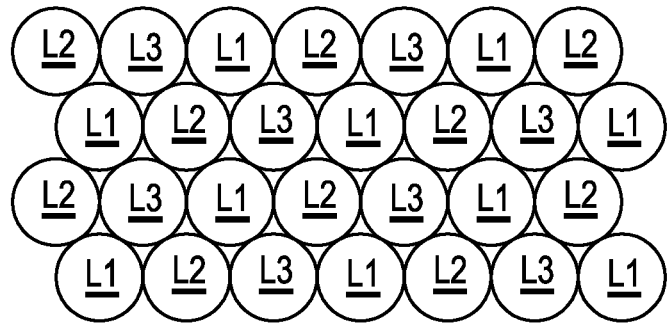
FIG. 7 shows a schematic view from above of a partial region of an alternative embodiment of a printed circuit board according to the invention along a horizontal section through the layer plane of the copper foil.
FIG. 8 shows a schematic view from above of a partial region of a further embodiment of a printed circuit board according to the invention.

FIG. 7 shows an alternative embodiment of a printed circuit board produced according to the method according to the invention in a schematic view from above along a section through the layer plane of the copper foil similar to FIG. 6. Analogously to the embodiment described above, here as well the holes—identified by "L1"—of a first hole matrix were firstly produced and then filled with metal. Afterward, the holes—identified by "L2"—of a second hole matrix were produced and filled with metal. Finally, the holes—identified by "L3"—of a third hole matrix were produced and filled with metal. In terms of their geometric dimensions and in terms of their relative arrangement the three hole matrices are fashioned such that together they form a hexagonal close-packed structure. This means that each hole of a hole matrix is surrounded by six adjacent holes of the other two hole matrices arranged at identical distances. The area utilization can be increased even further as a result.

FIG. 8 shows a further embodiment of a printed circuit board produced according to the method according to the invention in a schematic view from above, once again along a section through the layer plane of the copper foil. In this embodiment, the holes L1 and L2 were produced with the aid of an etching method. In contrast to the embodiments described above, the holes have an approximately and substantially square shape and together form a checkered pattern. The area utilization can be increased to almost 100% as a result.

By gradation of the square sizes, e.g. 200 µm edge length in the first pass and 220 µm edge length in the second pass, it is possible to produce overlap regions which compensate for any possibly occurring offset and, as a result of the overlap, would lead to the dielectric being removed without residues. The linking/connecting to the contact pad would thus be 100% in conjunction with a leveled surface.

We claim:

1. Method for contacting a metallic contact pad embedded in a printed circuit board layer sequence, comprising the following steps:
    producing a first hole matrix having a plurality of first holes in a surface of the printed circuit board layer sequence in order to partly expose the metallic contact pad;
    applying a metal layer in order to at least partly fill the first holes;
    producing a second hole matrix having a plurality of second holes in the surface of the printed circuit board layer sequence in order to partly expose the metallic contact pad, wherein the holes of the second hole matrix are arranged in a manner offset relative to the holes of the first hole matrix such that the second holes of the second hole matrix are arranged at different positions than the first holes of the first hole matrix; and
    applying a metal layer in order to at least partly fill the second holes.

2. Method according to claim 1, wherein the first hole matrix is formed by a first grid and the second hole matrix is formed by a second grid.

3. Method according to claim 2, wherein the first grid and the second grid are rectangular.

4. Method according to claim 2, wherein the first grid and the second grid are spanned by a two-dimensional basis {a,b}, wherein the holes of the first grid are arranged at the locations (n,m), and wherein the holes of the second grid are arranged at the locations, wherein n and m are to be selected from the set of integers≥0.

5. Method according to claim 1, wherein the first hole matrix and the second hole matrix comprise circular holes.

6. Method according to claim 1, wherein the first hole matrix and the second hole matrix comprise rectangular or square holes.

7. Method according to claim 6, wherein the first hole matrix and the second hole matrix together form a checkered pattern.

8. Method according to any one of claim 1, wherein a third hole matrix having a plurality of third holes is produced in the surface of the printed circuit board layer sequence in order to partly expose the metallic contact pad, wherein the holes of the third hole matrix are arranged in a manner offset relative to the holes of the first and second hole matrices, wherein producing the third hole matrix is followed by applying a metal layer, such that the third holes are at least partly filled with metal.

9. Method according to claim 1, wherein the holes are produced by a laser drilling method, or an etching method, or a combination of the laser drilling method and the etching method.

10. Method according to claim 1, wherein applying the metal layer is carried out by an electrolytic filling method.

11. Printed circuit board comprising a printed circuit board layer sequence and at least one metallic contact pad embedded therein, wherein the at least one metallic contact pad is contacted by the method according to claim 1.

12. Printed circuit board comprising:
    a printed circuit board layer sequence and at least one metallic contact pad embedded therein;
    a first hole matrix having a plurality of first holes extending from a surface of the printed circuit board layer sequence to the at least one metallic contact pad;
    a second hole matrix having a plurality of second holes extending from the surface of the printed circuit board layer sequence to the at least one metallic contact pad;
    the second holes of the second hole matrix are offset relative to the first holes of the first hole matrix such that the second holes of the second hole matrix are arranged at different positions than the first holes of the first hole matrix; and
    the first holes are at least partly filled with a first metal layer and the second holes are at least partly filled with a second metal layer.

13. Printed circuit board according to claim 12, wherein the first hole matrix is formed by a first grid and the second hole matrix is formed by a second grid.

14. Printed circuit board according to claim 13, wherein the first grid and the second grid are rectangular.

15. Printed circuit board according to claim 13, wherein the first grid and the second grid are spanned by a two-dimensional basis {a,b}, wherein the holes of the first grid are arranged at the locations (n,m), and wherein the holes of the second grid are arranged at the locations ((n+½),(m+½)), wherein n and m are to be selected from the set of integers≥0.

16. Printed circuit board according to claim 12, wherein the first hole matrix and the second hole matrix comprise circular holes.

17. Printed circuit board according to claim 12, wherein the first hole matrix and the second hole matrix comprise rectangular holes.

18. Printed circuit board according to claim 17, wherein the first hole matrix and the second hole matrix together form a checkered pattern.

19. Printed circuit board according to claim 12, wherein the second metal layer for filling the second hole matrix is at least partially deposited on the first metal layer for filling the first hole matrix.

20. Printed circuit board according to claim 12, wherein the first hole matrix and the second hole matrix comprise square holes.

* * * * *